(12) United States Patent
Hiramitsu et al.

(10) Patent No.: US 8,183,681 B2
(45) Date of Patent: May 22, 2012

(54) SEMICONDUCTOR DEVICE

(75) Inventors: Shinji Hiramitsu, Kashiwa (JP);
Hiroyuki Ohta, Tsuchiura (JP); Koji Sasaki, Mito (JP); Masato Nakamura, Fujisawa (JP); Osamu Ikeda, Yokohama (JP); Satoshi Matsuyoshi, Takahagi (JP)

(73) Assignee: Hitachi, Ltd., Tokyo (JP)

( * ) Notice: Subject to any disclaimer, the term of this patent is extended or adjusted under 35 U.S.C. 154(b) by 173 days.

(21) Appl. No.: 12/493,502

(22) Filed: Jun. 29, 2009

(65) Prior Publication Data
US 2009/0321783 A1    Dec. 31, 2009

(30) Foreign Application Priority Data
Jun. 30, 2008  (JP) ................. 2008-169774

(51) Int. Cl.
*H01L 23/48*   (2006.01)
(52) U.S. Cl. ........ 257/688; 257/676; 257/719; 257/747; 257/E23.044; 257/E23.051
(58) Field of Classification Search ........ 257/623, 257/676, 688–690, 712, 718, 719, 724, 727, 257/747, 779, E23.044, E23.051, E23.071, 257/E23.101, E23.11, 669; 438/123
See application file for complete search history.

(56) References Cited

U.S. PATENT DOCUMENTS

| | | | | |
|---|---|---|---|---|
| 3,713,007 A | * | 1/1973 | Walter ........................... | 257/727 |
| 4,349,831 A | | 9/1982 | Theroux | |
| 5,196,251 A | * | 3/1993 | Bakhru et al. ................... | 428/76 |
| 5,206,793 A | * | 4/1993 | Boudrant et al. ............. | 257/689 |
| 5,302,856 A | * | 4/1994 | Narita et al. .................... | 257/788 |
| 5,886,403 A | * | 3/1999 | Yoshinaga et al. ............. | 257/688 |
| 6,331,730 B1 | * | 12/2001 | Terasaki et al. ................ | 257/688 |
| 6,476,480 B1 | * | 11/2002 | Staab et al. ..................... | 257/693 |
| 6,812,560 B2 | * | 11/2004 | Recktenwald et al. ........ | 257/697 |
| 7,009,223 B1 | * | 3/2006 | Huang ........................... | 257/177 |
| 7,030,476 B2 | * | 4/2006 | Park et al. ...................... | 257/678 |
| 7,193,319 B2 | * | 3/2007 | Sasaki et al. ................... | 257/724 |
| 7,211,888 B2 | * | 5/2007 | Berry ............................. | 257/697 |

(Continued)

FOREIGN PATENT DOCUMENTS

JP      2005-183637      7/2005

(Continued)

OTHER PUBLICATIONS

Office Action issued in Japanese Patent Application No. 2008-169774 on Feb. 1, 2011.

*Primary Examiner* — Matthew Landau
*Assistant Examiner* — Joseph C Nicely
(74) *Attorney, Agent, or Firm* — Antonelli, Terry, Stout & Kraus, LLP.

(57) ABSTRACT

A semiconductor device which includes a semiconductor chip; an electrically conductive base electrode bonded to the lower surface of the chip by a first bonding member; an electrically conductive lead electrode bonded to the upper surface of the chip by a second bonding member; and a first stress relief member for reducing stress developed in the first bonding member due to the difference in thermal expansion between the chip and the base electrode. Both the base electrode and the first stress relief member are in direct contact with the lower surface of the first bonding member. A protrusion is formed upstanding from the base electrode in direct contact with the first bonding member, and the first stress relief member surrounds a circumferential portion of the protrusion.

12 Claims, 5 Drawing Sheets

U.S. PATENT DOCUMENTS

| | | | | |
|---|---|---|---|---|
| 7,294,912 | B2* | 11/2007 | Takeuchi et al. | 257/675 |
| 7,357,173 | B2* | 4/2008 | Griesmayer | 165/80.3 |
| 7,692,299 | B2* | 4/2010 | Nakajima et al. | 257/747 |
| 7,959,321 | B2* | 6/2011 | Ryu et al. | 362/231 |
| 2001/0023118 | A1* | 9/2001 | MacPherson et al. | 438/584 |
| 2002/0140059 | A1* | 10/2002 | Yamazaki et al. | 257/658 |
| 2004/0140419 | A1* | 7/2004 | Hsieh et al. | 250/214 R |
| 2004/0212072 | A1* | 10/2004 | Wu | 257/690 |
| 2005/0035446 | A1* | 2/2005 | Karpman et al. | 257/711 |
| 2005/0250252 | A1* | 11/2005 | Li | 438/123 |
| 2005/0253208 | A1* | 11/2005 | Otani | 257/415 |
| 2006/0166406 | A1* | 7/2006 | Lin | 438/110 |
| 2006/0214291 | A1* | 9/2006 | Sasaki et al. | 257/734 |
| 2006/0246304 | A1* | 11/2006 | Ishihara et al. | 428/446 |
| 2007/0182018 | A1* | 8/2007 | Pendse | 257/777 |
| 2008/0042258 | A1* | 2/2008 | Ooi et al. | 257/700 |
| 2008/0122050 | A1* | 5/2008 | Ikeda et al. | 257/669 |
| 2008/0188030 | A1* | 8/2008 | Kang | 438/65 |
| 2008/0247436 | A1* | 10/2008 | Carter et al. | 372/50.11 |
| 2009/0290054 | A1* | 11/2009 | Shimizu et al. | 348/294 |
| 2010/0044844 | A1* | 2/2010 | Matsumi et al. | 257/676 |
| 2011/0045637 | A1* | 2/2011 | Shin et al. | 438/113 |
| 2011/0136336 | A1* | 6/2011 | Akram et al. | 438/613 |

FOREIGN PATENT DOCUMENTS

JP    2007-067158    3/2007

* cited by examiner

PRIOR ART

SEMICONDUCTOR DEVICE

BACKGROUND OF THE INVENTION

This invention relates to a semiconductor device, and more particularly to a rectifying device for use with a rotary generator mounted on a vehicle.

In general, a rectifying device for use with a rotary generator mounted on a vehicle comprises a semiconductor chip having a rectifying function, a conductive lead electrode, a base electrode, and solder layers for bonding them together in laminated structure, wherein the peripheral portions of the semiconductor chip are hermetically sealed with such resin as silicone rubber.

When the rotary generator mounted on a vehicle operates, the semiconductor chip generates heat since large electric current flows through the rectifying device; and accordingly the semiconductor chip, the bonding solder layers, the lead electrode and the base electrode are heated up to at least 200° C. When the rotary generator stops operating, the current stops flowing and the rectifying device is cooled down to ambient temperatures. Since such a generator repeats cycles of operation and halt over a long period of time, the rectifying device undergoes the repetition of expansion due to heating and contraction due to cooling. If the thermal expansion coefficient of the semiconductor chip is different from those of the lead electrode and the base electrode, as is often the case, then thermal stress is generated in the solder layers for bonding them to each other. The thermal stress results in cracks due to thermal fatigue in the solder layers, the cracks increase in length and width, and finally the semiconductor device will be destroyed. U.S. Pat. No. 4,349,831 discloses a configuration which can reduce thermal stress in solder layers. This U.S. patent discloses a rectifying device wherein first and second stress relief members are provided between a semiconductor element and an electrode connected with a flexible wire lead and between the semiconductor element and a base member, the thermal expansion coefficient of each of the stress relief members being greater than that of the semiconductor element and smaller than those of the electrode and the base member, and wherein the first stress relief member is interposed between the base member and the semiconductor element and bonded to them by solder layers while the second stress relief member is interposed between the enlarged portion of the electrode and the semiconductor element and bonded to them by the solder layer.

SUMMARY OF THE INVENTION

The recent rapid increase in the number of electronic parts equipped in an automobile has come to require an increase in the power capacity of the rotary generator mounted on the vehicle. Accordingly, it is expected that such power increase results in the heat generation in the semiconductor chip of the rectifying device and therefore the increase in the thermal stress in the solder layers.

In order to meet such needs while maintaining reliability equal to or higher than those which the conventional rectifying devices can achieve, it is necessary to reduce the thermal stress in the solder layers and thereby to suppress thermal fatigue of the solder layers, to a greater extent than before.

The way to reduce the thermal stress in the solder layers is, for example, to employ a structure wherein the heat generated in the semiconductor chip is easily dissipated to outside so that the amplitude of change in the solder temperature may be reduced, or a structure wherein stress in the solder layers can be reduced even under a large amplitude of change in the solder temperature.

In the above mentioned prior art, the stress relief members are provided between the semiconductor element and the electrode and between the semiconductor element and the base member, so as to obtain the effect of relaxing stress. With this structure, however, there must be additionally provided with the stress relief members and the solder layers for attaching these stress relief members to the electrode and the base member. Consequently, this increase in the constituent elements deteriorates the performance of heat dissipation.

The object of this invention, which has been made to solve problems present in the above described prior art, is to provide a semiconductor device which can achieve a high performance in the stress relaxation while maintaining a high performance in the heat dissipation so that the thermal stress in the solder layers is reduced and that the thermal fatigue in the solder layers is suppressed.

According to this invention, there is provided a semiconductor device including a base electrode; a semiconductor chip having a rectifying function, attached to the base electrode by a first bonding member; a lead electrode for connection with a lead wire, attached to the upper surface of the semiconductor chip by a second bonding member; and a first stress relief member for reducing stress developed in the first bonding member, wherein both the base electrode and the first stress relief member are in direct contact with that surface of the first bonding member which faces the base electrode.

According to this invention, both high heat dissipation and stress relaxation performances can be compatibly attained since an area is formed where the base electrode and the stress relief member for reducing stress developed in the bonding member for bonding the semiconductor chip and the base electrode are in direct contact with the surface of the bonding member which faces the base electrode.

Other objects, features and advantages of the invention will become apparent from the following description of the embodiments of the invention taken in conjunction with the accompanying drawings.

DETAILED DESCRIPTION OF THE EMBODIMENTS

Now, embodiments of this invention will be described below in reference to the attached drawings.

Embodiment 1

Figure 1:
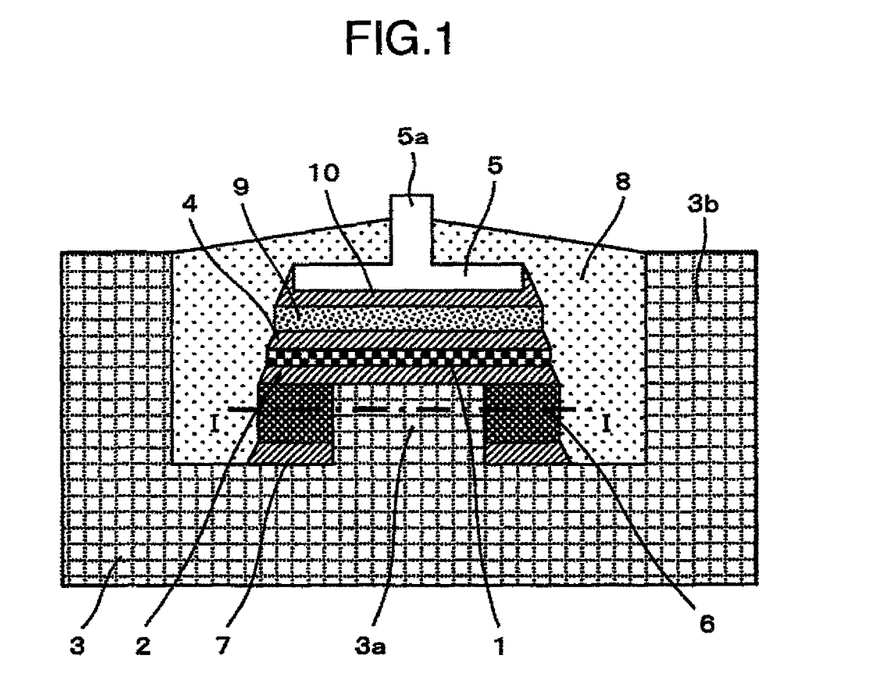
FIG. 1 is a vertical cross section of a semiconductor device as a first embodiment of this invention.

FIG. 1 is a vertical cross section of a semiconductor device according to a first embodiment of this invention. The semiconductor device shown in FIG. 1 comprises a semiconductor chip 1, a first bonding member 2, a base electrode 3 having a protrusion 3a and a wall portion 3b, a second bonding member 4, a lead electrode 5 having a lead portion 5a, a first stress relief member 6, a third bonding member 7, a stress relief plate 9, and a fourth bonding member 10.

The protrusion 3a of the base electrode 3 and the first stress relief member 6 are so disposed that they can be both in direct contact with the lower surface of the first bonding member 2 attached to the lower surface of the semiconductor chip 1.

Figure 2:
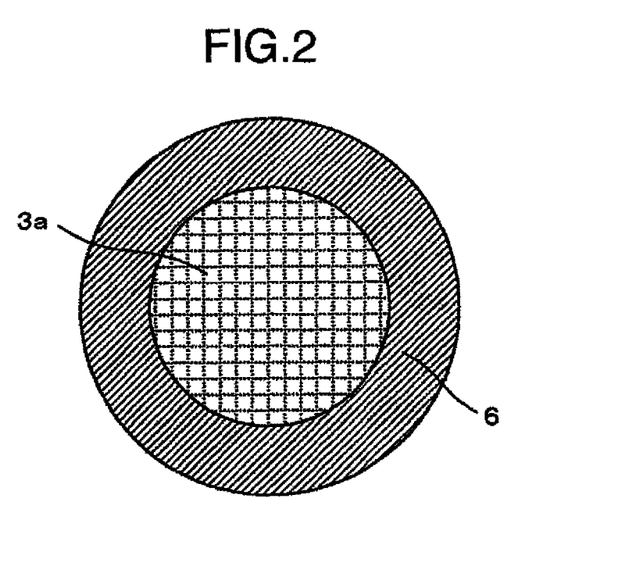
FIG. 2 is a horizontal cross section taken along the line I-I in FIG. 1 of the semiconductor device according to the first embodiment of this invention in FIG. 1.

FIG. 2 is a horizontal cross section taken along the line I-I in FIG. 1 of the semiconductor device according to the first embodiment of this invention shown in FIG. 1. The protrusion 3a of the base electrode 3 has a cylindrical shape. The first stress relief member 6 is disposed around the protrusion 3a of the base electrode 3, that is, annular in shape covering the cylindrical surface of the protrusion 3a. The cross-sectional shapes of the protrusion 3a and the first stress relief member 6 are circular.

The first stress relief member 6 is press-fitted around the protrusion 3a of the base electrode 3 and is therefore in direct contact with the protrusion 3a in a cylindrical surface approximately perpendicular to the lower surface of the semiconductor chip 1.

Namely, the outer cylindrical surface of the protrusion 3a and the inner cylindrical surface of the first stress relief member 6 having an annular shape are in direct contact with each other. Also, the first stress relief member 6 is bonded to the base electrode 3 by the third bonding member 7, in a plane approximately parallel to the lower surface of the semiconductor chip 1. More specifically, the plane surface of the first stress relief member 6 which is opposite to the semiconductor chip 1 (i.e. facing the base electrode 3) is bonded to the base electrode 3 by the third bonding member 7.

The stress relief plate 9 is bonded to the upper surface of the semiconductor chip by the second bonding member 4 so as to relax the stress developed in the bonding members provided between the semiconductor chip 1 and the lead electrode 5. The lead electrode 5 is bonded to the upper surface of the stress relief plate 9 by the fourth bonding member 10.

The space inside the wall portion 3b of the base electrode 3 is filled with sealing resin 8, which is in this case silicone rubber for hermetical sealing.

The first bonding member 2, the second bonding member 4, the third bonding member 7 and the fourth bonding member 10 are of Sn—Cu system solder which is free of lead Pb. Both of the first stress relief member 6 and the stress relief plate 9 must have a linear expansion coefficient in a range from $3 \times 10^{-6}/°C.$ to $12 \times 10^{-6}/°C.$ In this case, they are made of molybdenum (Mo with linear expansion coefficient of $5.1 \times 10^{-6}/°C.$). They may also be made of tungsten (W with linear expansion coefficient of $4.5 \times 10^{-6}/°C.$), Fe-42% Ni alloy (commonly referred to as 42 alloy, with linear expansion coefficient of $5 \times 10^{-6}/°C.$), CIC (Cu-Invar-Cu laminated composite, Invar with linear expansion coefficient of $2.8 \times 10^{-6}/°C.$, Cu with linear expansion coefficient of $16.5 \times 10^{-6}/°C.$), or PCM (composite of Cu and Mo with equivalent linear expansion coefficient of $7.3 \times 10^{-6}/°C.$), to obtain the same effect as with Mo. The stress relief member 6 may be different in material from the stress relief plate 9.

Figure 7:
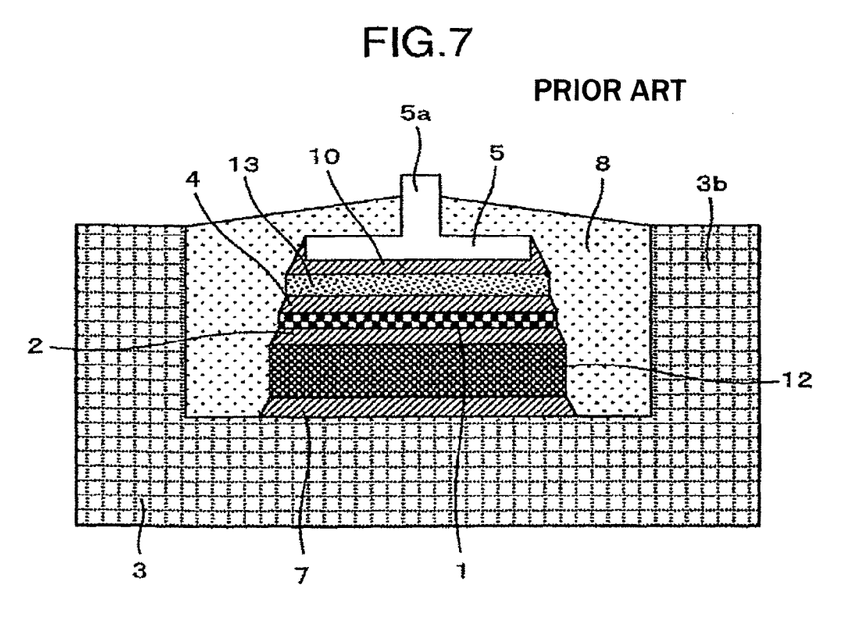
FIG. 7 is a vertical cross section of a conventional semiconductor device.

Now, the advantages of this embodiment will be explained in comparison with those of a typical conventional semiconductor device of similar kind. FIG. 7 is a vertical cross section of a conventional semiconductor device. In FIG. 7, parts equivalent to those shown in FIG. 1 are indicated by the same reference numerals. This conventional semiconductor device has a structure wherein a first stress relief plate 12 is disposed on a base electrode 3 with a third bonding member 7 interposed therebetween; a semiconductor chip 1 is disposed on the upper surface of the first stress relief member 12 with a first bonding member 2 interposed therebetween; a second stress relief plate 13 is disposed on the upper surface of the semiconductor chip 1 with a second bonding member 4 interposed therebetween; a lead electrode 5 is disposed on the upper surface of the second stress relief plate 13 with a fourth bonding member 10 interposed therebetween; and all these components are hermetically sealed with sealing resin 8.

Figure 8:
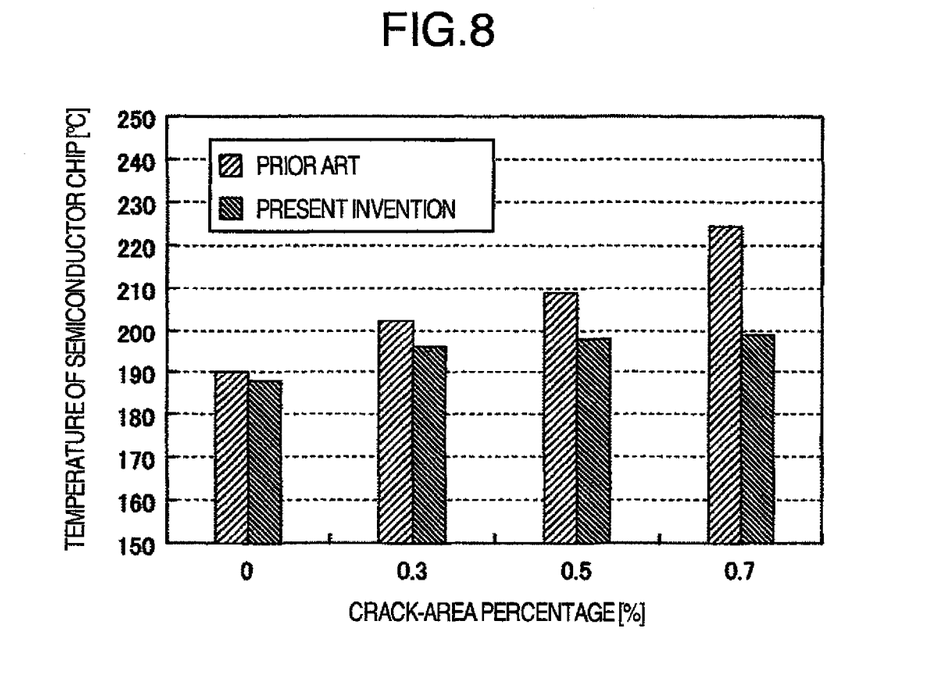
FIG. 8 is a graphical representation of a relationship between the crack-area percentage in bonding member and the temperature of semiconductor chip, for the conventional semiconductor device and the semiconductor device according to the first embodiment of this invention, when they are powered.

FIG. 8 is a graphical representation of a relationship between the crack-area percentage in bonding member and the temperature of semiconductor device, for the conventional semiconductor device shown in FIG. 7 and the semiconductor device according to the first embodiment of this invention, observed when they are powered. The "crack-area percentage in bonding member" mentioned here is defined as the value equal to the total area of the cracks due to fatigue over the bonding area divided by the bonding area. This graph has been obtained as a result of thermal conduction analysis of the semiconductor devices performed under a powered condition in simulation. In the circumstances of actual application, it hardly happens that cracks due to fatigue develop in the bonding members on the upper and lower surfaces of the semiconductor chip. In the model employed here, therefore, it is assumed that such cracks develop only in the other bonding members. Additionally, the ratio of the outer diameter of the first stress relief member, which is attached to the lower surface of the first bonding member attached to the lower surface of the semiconductor chip, to the outer diameter of the base electrode is set to 5:3. In the thermal conduction analysis in which the temperature of the semiconductor chip is calculated, a loss of 35 W is generated so that the base electrode is heated from 50° C. to 80° C. Consequently, in the comparison of the first embodiment of this invention with the conventional semiconductor device, although the temperature of the semiconductor device as the first embodiment of this invention is only slightly different from that of the conventional semiconductor device in the initial stage of the analysis, the former becomes appreciably lower than the latter when the crack-area percentage in bonding member increases. Namely, the degradation of heat dissipation performance is lower in the former than in the latter. This indicates that the semiconductor device according to the first embodiment of this invention has a higher heat dissipation performance than the conventional semiconductor device.

Figure 9:
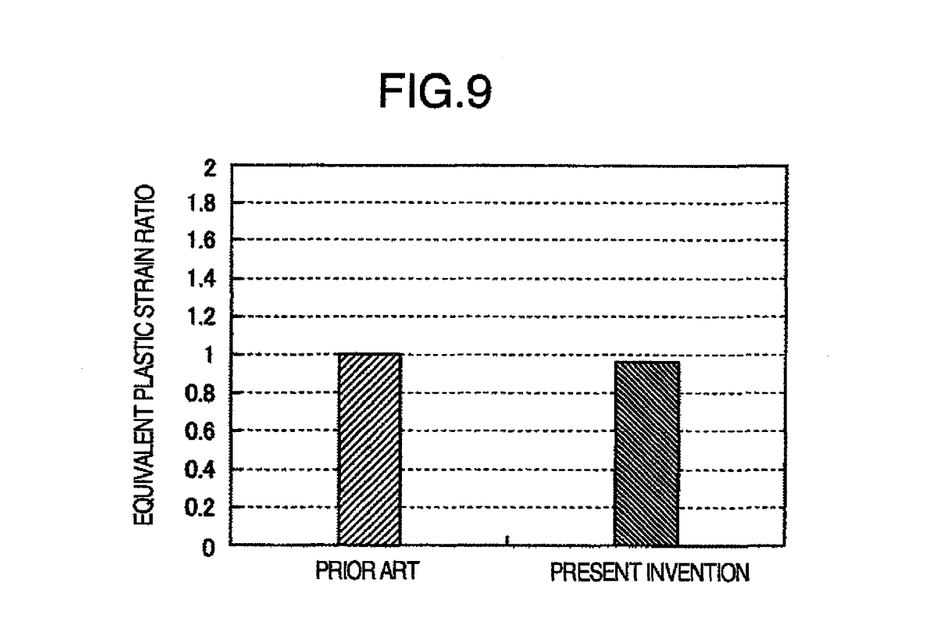
FIG. 9 is a graphical representation of a result of comparison of the semiconductor device according to the first embodiment of this invention with the conventional semiconductor device, with respect to the stresses developed in the bonding members during power being supplied.

FIG. 9 is a graphical representation of a result of comparison of the semiconductor device according to the first embodiment of this invention with the conventional semiconductor device, with respect to the stresses developed in the bonding members during power being supplied. More precisely, this comparison is made in terms of equivalent plastic strain developed in the first bonding member 2 under the condition of power being supplied. It is understood from this comparison that the strain in the semiconductor device according to this invention is almost the same as that in the conventional semiconductor device. Therefore, it can be concluded from the foregoing that the semiconductor device according to the first embodiment of this invention has a higher heat dissipation performance than the conventional semiconductor device, and that they have almost the same strain relaxation performance. It is to be noted here that this invention is not limited to the first embodiment described hitherto, but that this invention can be practiced in other modes to be described below.

In the first embodiment of this invention described above in reference to FIG. 1, the stress relief plate 9 is attached to the upper surface of the semiconductor chip 1. However, the stress relief plate 9 is not necessarily required.

Also, in the first embodiment described above in reference to FIG. 1, the base electrode 3 has the wall portion 3b. However, the wall portion 3b is not necessarily required.

Further, in the first embodiment described above in reference to FIG. 1, the first stress relief member 6 is not in contact with the wall portion 3b of the base electrode 3. However, the first stress relief member 6 may be in contact with the wall portion 3b of the base electrode 3.

Moreover, in the first embodiment described above in reference to FIG. 1, the base electrode 3 and the first stress relief member 6 are both attached to the lower surface, i.e. horizontal plane, of the semiconductor chip 1 by the first bonding member 2. However, both the base electrode 3 and the first stress relief member 6 may be brought in direct contact with the semiconductor chip 1 without the first bonding member 2.

Figure 3:
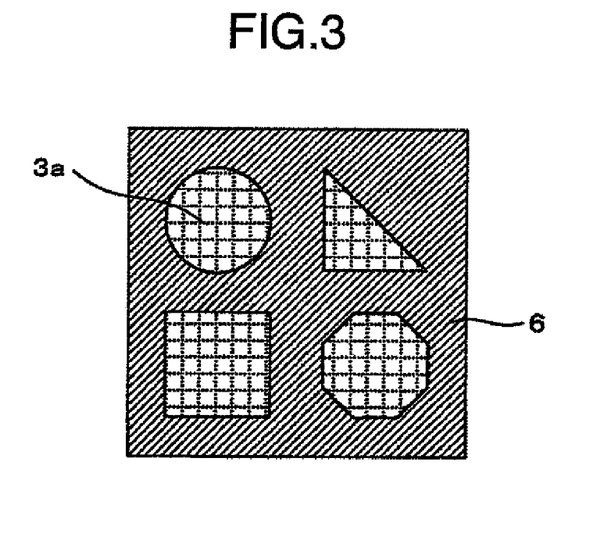
FIG. 3 is a horizontal cross section taken along the line I-I in FIG. 1 of a variation of the protrusion of the base electrode and of the stress relief member fitted around the protrusion.

FIG. 3 is a horizontal cross section taken along the line I-I in FIG. 1 of a variation of the protrusion of the base electrode and of the stress relief member. The cross section of the protrusion 3a of the base electrode 3 and that of the first stress relief member 6 need not necessarily be circular. Also, the base electrode 3 may be provided with more than one protrusion. For example, as shown in FIG. 3, the protrusions can be in various forms upstanding from the upper surface of the base electrode 3, with the first stress relief member 6 fitted around them.

Figure 4:
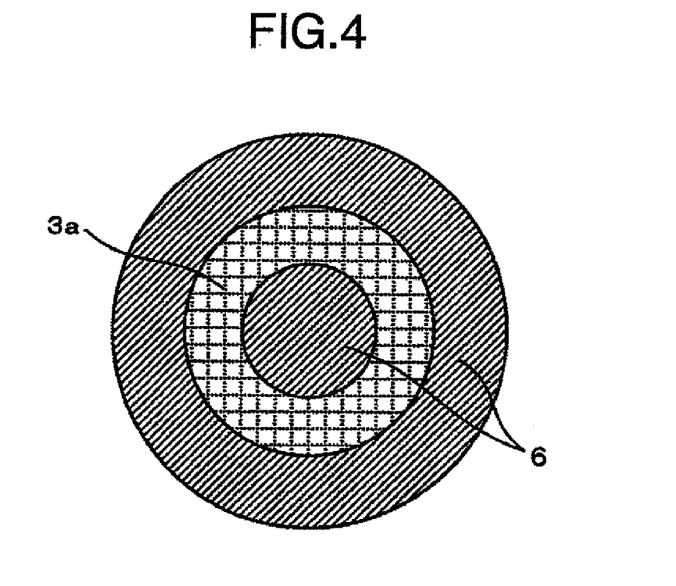
FIG. 4 is a horizontal cross section taken along the line I-I in FIG. 1 of another variation of the protrusion of the base electrode and another variation of the stress relief member fitted around the protrusion.

FIG. 4 is a horizontal cross section taken along the line I-I in FIG. 1 of a variation of the protrusion of the base electrode and another variation of the stress relief member. As shown in the cross section in FIG. 4, the first stress relief member 6 and the protrusion 3a of the base electrode 3 may be disposed in concentric relationship with each other.

Using either structure as shown in FIG. 3 or FIG. 4 can also provide the same effect as obtained with the structure shown in FIG. 1.

Embodiment 2

Figure 5:
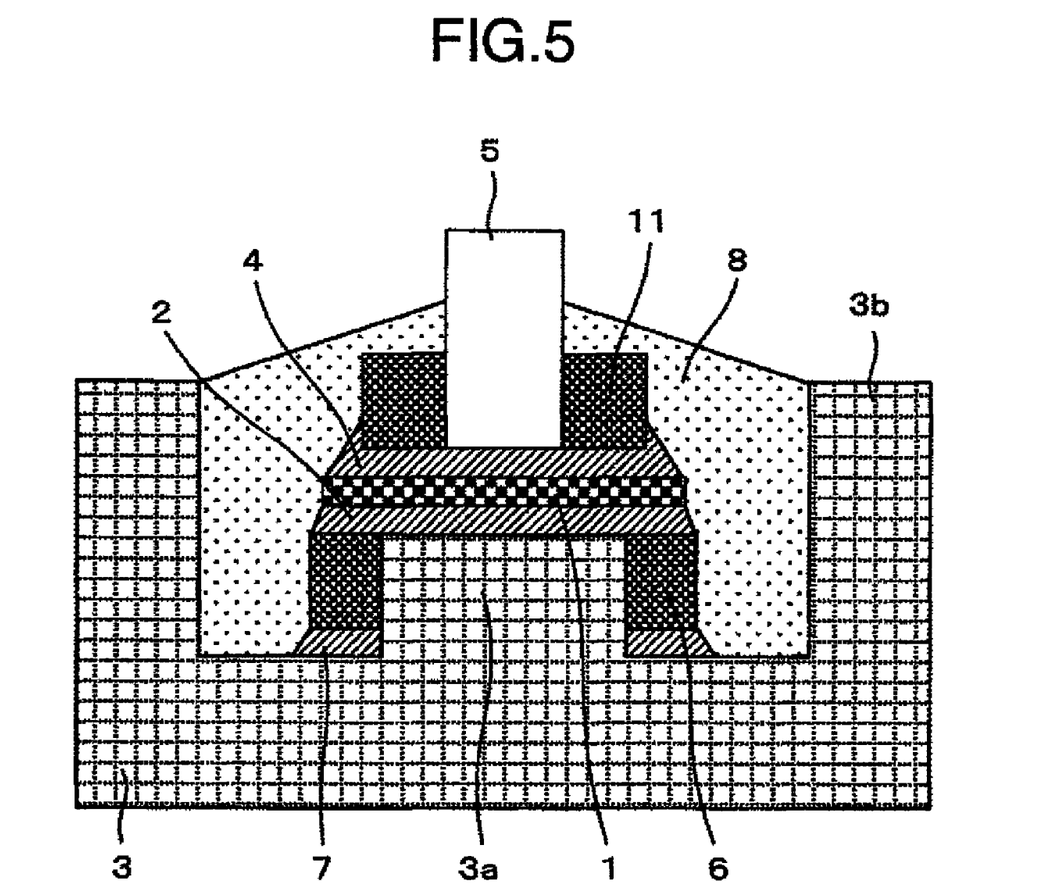
FIG. 5 is a vertical cross section of a semiconductor device as a second embodiment of this invention.

FIG. 5 is a vertical cross section of a semiconductor device according to a second embodiment of this invention. This second embodiment differs from the first embodiment shown in FIG. 1 in that a second stress relief member 11 is used instead of the stress relief plate 9 and that the lead electrode 5 and the second stress relief member 11 are disposed in direct contact with the upper surface of the second bonding member 4 attached to the upper surface of the semiconductor chip 1. With this configuration, high performance in heat dissipation from the lead electrode 5 as well as from the base electrode 3 can be secured while a high degree of stress relaxation is effected in the first and second bonding members 2 and 4 which are attached to the lower and upper surfaces of the semiconductor chip 1.

Figure 6:
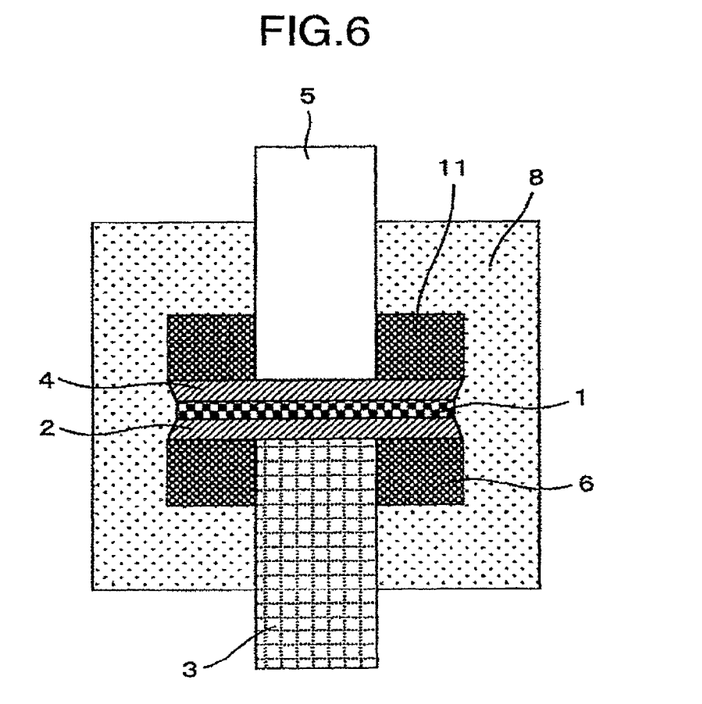
FIG. 6 is vertical cross section of a variation of the base electrode used in the semiconductor device as the second embodiment of this invention.

FIG. 6 is a vertical cross section of a variation of the base electrode used in the semiconductor device according to the second embodiment of this invention shown in FIG. 5. As shown in FIG. 6, the base electrode 3 need not necessarily have the protrusion 3a and the wall portion 3b.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device comprising:
   a base electrode;
   a semiconductor chip having a rectifying function attached to said base electrode by a first bonding member;
   a lead electrode for connection with a lead wire, attached to an upper surface of said semiconductor chip by a second bonding member; and
   a first stress relief member which reduces stress developed in said first bonding member,
   wherein both said base electrode and said first stress relief member are in direct contact with a surface of said first bonding member which faces said base electrode,
   wherein at least one protrusion is formed upstanding from said base electrode on a side of said semiconductor chip, and said protrusion is in direct contact with the surface of said first bonding member which faces said base electrode, and
   wherein said first stress relief member is disposed surrounding a circumferential surface of said protrusion.

2. The semiconductor device as claimed in claim 1, wherein said first stress relief member is disposed between a lower surface of said first bonding member within its area and the base electrode.

3. The semiconductor device as claimed in claim 1, wherein said first bonding member and said second bonding member are comprised of lead-free alloy having tin and copper as its main ingredients, a weight percent of copper in said alloy being equal to or less than 5%.

4. A semiconductor device comprising:
   a base electrode;
   a semiconductor chip having a rectifying function attached to said base electrode by a first bonding member;
   a lead electrode for connection with a lead wire, attached to an upper surface of said semiconductor chip by a second bonding member; and
   a first stress relief member which reduces stress developed in said first bonding member;
   wherein both said base electrode and said first stress relief member are in direct contact with a surface of said first bonding member which faces said base electrode;
   wherein a protrusion of said base electrode is formed upstanding on a side of said semiconductor chip, and the protrusion is in direct contact with the surface of said first bonding member which faces said base electrode; and
   wherein said protrusion is in a form of cylinder; said first stress relief member is in an annular shape and disposed concentrically around said protrusion; and a circumferential surface of said protrusion is in direct contact with an inner surface of said first stress relief member.

5. A semiconductor device comprising:

a base electrode;

a semiconductor chip having a rectifying function attached to said base electrode by a first bonding member;

a lead electrode for connection with a lead wire, attached to an upper surface of said semiconductor chip by a second bonding member; and a first stress relief member which reduces stress developed in said first bonding member;

wherein both said base electrode and said first stress relief member are in direct contact with a surface of said first bonding member which faces said base electrode; and wherein a plurality of pillar-like protrusions are formed upstanding from said base electrode on a side of said semiconductor chip, and said first stress relief member is disposed surrounding circumferential surfaces of said plural pillar-like protrusions.

6. A semiconductor device comprising:

a base electrode having a wall portion around periphery of the device;

a semiconductor chip having a rectifying function attached to said base electrode by a first bonding member;

a lead electrode which connects with a lead wire, said lead electrode attached to a upper surface of said semiconductor chip by a second bonding member;

a first stress relief member which reduces stress developed in said first bonding member; and a second stress relief member which reduces stress developed in said second bonding member, wherein both said base electrode and said first stress relief member are in direct contact with a surface of said first bonding member on a side of said base electrode, and wherein both said lead electrode and said second stress relief member are in direct contact with a surface of said second bonding member on a side of said lead electrode, wherein at least one protrusion is formed upstanding from said base electrode on a side of said semiconductor chip, and said protrusion is in direct contact with the surface of said first bonding member which faces said base electrode; and wherein said first stress relief member is disposed surrounding a circumferential surface of said protrusion.

7. The semiconductor device as claimed in claim 6, wherein said first stress relief member and said second stress relief member have a linear expansion coefficient in a range from $3 \times 10^{-6}/°C$ to $8 \times 10^{-6}/°C$.

8. The semiconductor device as claimed in claim 7, wherein said first stress relief member and said second stress relief member are comprised of Mo, W or Fe—Ni alloy.

9. The semiconductor device as claimed in claim 7, wherein said first stress relief member and said second stress relief member are comprised of a composite material consisting of copper and any of Mo, W or Fe—Ni alloy.

10. The semiconductor device as claimed in claim 6, wherein said first stress relief member and said second stress relief member are comprised of Mo, W or Fe—Ni alloy.

11. The semiconductor device as claimed in claim 6, wherein said first stress relief member and the second stress relief member are comprised of a composite material consisting of copper and any of Mo, W or Fe—Ni alloy.

12. The semiconductor device as claimed in claim 6, wherein said first bonding member and said second bonding member are comprised of lead-free alloy having tin and copper as its main ingredients, said a weight percent of copper in said alloy being equal to or less than 5%.

* * * * *